United States Patent
Xia et al.

(10) Patent No.: US 12,049,692 B2
(45) Date of Patent: Jul. 30, 2024

(54) MANUFACTURING METHOD FOR GRAPHENE FILM, POROUS SILICA POWDER AND TRANSPARENT CONDUCTIVE LAYER

(71) Applicants: Beihai HKC Optoelectronics Technology Co., Ltd., Beihai (CN); HKC CORPORATION LIMITED, Shenzhen (CN)

(72) Inventors: Yuming Xia, Beihai (CN); En-Tsung Cho, Beihai (CN); Wei Li, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 441 days.

(21) Appl. No.: 17/382,292

(22) Filed: Jul. 21, 2021

(65) Prior Publication Data

US 2022/0056578 A1  Feb. 24, 2022

(30) Foreign Application Priority Data

Jul. 29, 2020 (CN) .......................... 202010745877.9

(51) Int. Cl.
| | |
|---|---|
| *H01L 21/768* | (2006.01) |
| *C23C 16/02* | (2006.01) |
| *C23C 16/18* | (2006.01) |
| *C23C 16/26* | (2006.01) |
| *C23C 16/44* | (2006.01) |
| *C23C 16/455* | (2006.01) |
| *G02F 1/1368* | (2006.01) |

(52) U.S. Cl.
CPC .......... *C23C 16/0281* (2013.01); *C23C 16/18* (2013.01); *C23C 16/26* (2013.01); *C23C 16/4417* (2013.01); *C23C 16/45553* (2013.01); *H01L 21/76838* (2013.01); *G02F 1/1368* (2013.01)

(58) Field of Classification Search
CPC ..... C23C 16/0281; C23C 16/18; C23C 16/26; C23C 16/4417; C23C 16/45553; C23C 16/45525–45555; H01L 21/76838; H01L 29/1606; H01L 21/02376; G02F 1/1368; G02F 1/13439; C01B 32/186; C01B 32/182–198; C01B 2204/00–32; H01B 1/04

See application file for complete search history.

(56) References Cited

U.S. PATENT DOCUMENTS

| | | | |
|---|---|---|---|
| 2007/0212538 A1* | 9/2007 | Niu | H01M 4/8657 252/502 |
| 2007/0265159 A1 | 11/2007 | Elam et al. | |
| 2014/0255500 A1 | 9/2014 | Son et al. | |
| 2020/0224311 A1* | 7/2020 | Niskanen | C23C 16/45525 |

* cited by examiner

*Primary Examiner* — Shahed Ahmed

(57) ABSTRACT

The present application discloses a manufacturing method for a graphene film, a porous silica powder and a transparent conductive layer. The manufacturing method for a graphene film includes steps of: providing a porous material powder; placing the porous material powder in an atomic layer deposition device; forming a porous material template having a metal catalyst layer in pores; and preparing the graphene film on the porous material template.

20 Claims, 6 Drawing Sheets

MANUFACTURING METHOD FOR GRAPHENE FILM, POROUS SILICA POWDER AND TRANSPARENT CONDUCTIVE LAYER The present application claims priority to Chinese Patent Application No. 202010745877.9, filed Jul. 29, 2020, which is hereby incorporated by reference herein as if set forth in its entirety.

TECHNICAL FIELD

The present application relates to the technical field of display, particularly to a manufacturing method for a graphene film, a porous silica powder and a transparent conductive layer.

BACKGROUND

The statements herein merely provide background information related to the present application and do not necessarily constitute the conventional art.

Display panels have been rapidly developed and widely used in recent years. Thin Film Transistor-LCD (TFT-LCD) in the mainstream market includes array substrates and color film substrates. Thin film transistors are formed on array substrates to control the switching of pixel electrodes; when the thin film transistors are turned on, the pixel electrodes generate voltage, enabling liquid crystal molecules to deflect and display pictures.

Transparent conductive layers such as pixel electrodes are generally made of Indium Tin Oxide (ITO). However, the ITO material has low conductivity and exhibits uneven light absorption in the visible light range, and a graphene film is the most suitable material to replace the ITO as the graphene film is superior to the ITO material in transparency and conductivity, and has characteristics that the ITO does not have in the flexibility field. How to produce the graphene film and improve its performance has become a growing concern.

SUMMARY

The present application aims to provide a manufacturing method for a graphene film, a porous silica powder and a transparent conductive layer.

The present application discloses a manufacturing method for a graphene film, including steps of:
providing a porous material powder;
putting the porous material powder into an atomic layer deposition device;
depositing a metal catalyst layer in pores of the porous material powder to form a porous material powder having the metal catalyst layer in the pores;
depositing the porous material powder in an organic alcohol solution and pressing to form a silica template, and
introducing a carbon source precursor on the silica template, letting grow for a preset time to form a graphene film.

The present application further discloses a manufacturing method for a porous silica powder having a metal catalyst layer in pores, including steps of:
A: placing a porous silica powder in an atomic layer deposition device;
B: continuously introducing a metal precursor into the atomic layer deposition device for a preset time, keeping for a preset time, and continuously introducing an inert gas for a preset time for purging;
C: continuously introducing a reducing gas into the atomic layer deposition device for a preset time, keeping for a preset time, and continuously introducing the inert gas for a preset time for purging; and
D: repeating the steps B and C for a preset number of times to acquire the porous silica powder having the metal catalyst layer in the pores.

The present application further discloses a manufacturing method for a transparent conductive layer of a display panel, including steps of:
providing a porous material powder;
placing the porous material powder in an atomic layer deposition device;
depositing a metal catalyst layer in the atomic layer deposition device and depositing the metal catalyst layer in pores of the porous material powder to form a porous material powder having the metal catalyst layer in the pores;
forming a porous material template having the metal catalyst layer in the pores by using the porous material powder having the metal catalyst layer in the pores; and
preparing a graphene film on the porous material template as the transparent conductive layer of a substrate of the display panel.

It is a breakthrough in the present application to deposit a metal catalyst layer in pores of a porous material powder by atomic layer deposition. In addition to being deposited on an outer surface of the powdered porous material, the metal catalyst layer can also be deposited in channels of the powdered porous material where the metal catalyst layer is hard to grow compared with at the outer surface, so that the porosity and specific surface area of the produced porous material template are higher, and more metal catalyst layers can be adsorbed, providing more possible deposition space for subsequent deposition of graphene; the produced graphene film has the characteristics of high porosity, easy control, high density, excellent conductivity and transparency and other properties, and is suitable for industrial application in panels of different sizes.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

Figure 1:
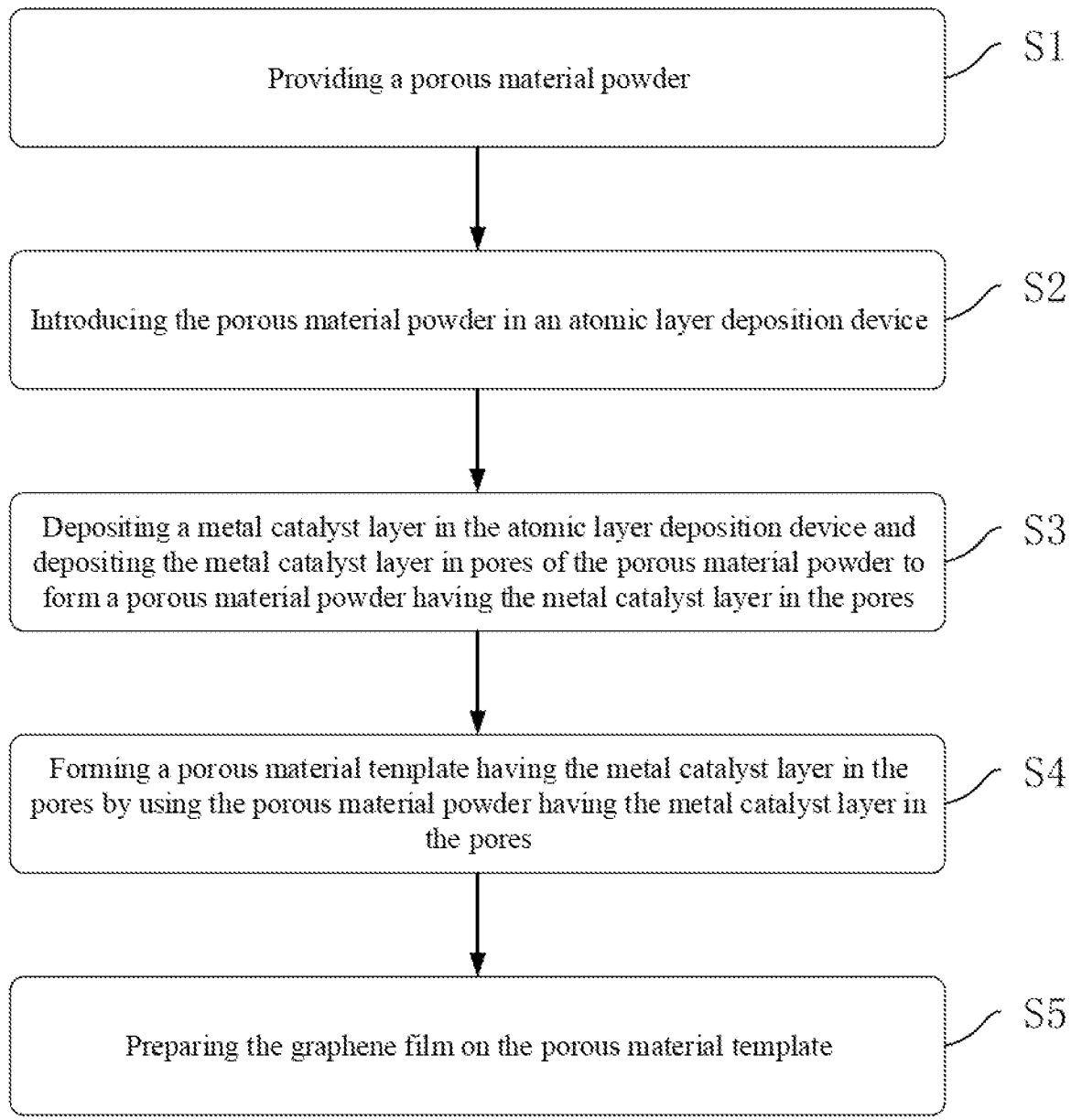
FIG. 1 is a schematic diagram of steps of a manufacturing method for a graphene film according to an embodiment of the present application.

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly. For example, it can be a fixed connection, a detachable connection, or an integral connection; it can be either a mechanical connection or an electrical connection; it can be a direct connection or an indirect connection through an intermediate medium, or an internal connection between two elements. For those skilled in the art, the specific meaning of the above terms in the present application can be understood according to specific circumstances.

The present application will now be described in details by reference to the accompanying drawings and optional embodiments.

Atomic Layer Deposition (ALD) is a special chemical vapor deposition technique, which is a method of forming a film by alternately introducing gas-phase precursor pulses into a reaction chamber of an atomic layer deposition device and allowing a chemisorption reaction on the surface of a deposition substrate. Precursor molecules reach the surface of the deposition substrate and will chemisorb and react on the surface, and the surface reaction of atomic layer deposition is self-limiting, i.e., chemisorption self-limiting and sequential reaction self-limiting. The self-limiting feature is the basis of atomic layer deposition. By repeating the self-limiting reaction to form nanoparticles or films, excellent three-dimensional conformal stoichiometric films can be produced.

The present application discloses a manufacturing method for a graphene film by ALD. As shown in FIG. 1, the method includes steps of:
S1: providing a porous material powder;
S2: placing the porous material powder in an atomic layer deposition device;
S3: depositing a metal catalyst layer in the atomic layer deposition device and depositing the metal catalyst layer in pores of the porous material powder to form a porous material powder having the metal catalyst layer in the pores;
S4: forming a porous material template having the metal catalyst layer in the pores by using the porous material powder having the metal catalyst layer in the pores; and
S5: preparing the graphene film on the porous material template.

In the present application, a metal catalyst layer is deposited in pores of a porous material powder by atomic layer deposition. Due to self-adsorption of surfaces in atomic layer deposition, the metal catalyst layer, in addition to being deposited on an outer surface of the powdered porous material, can also be deposited in channels of the powdered porous material where the metal catalyst layer is hard to grow compared with at the outer surface, so that the porosity and specific surface area of the produced porous material template are higher, and more metal catalyst layers can be adsorbed, providing more possible deposition space for subsequent deposition of graphene; the produced graphene film has the characteristics of high porosity, large specific surface area, easy control, high density, excellent conductivity and transparency and other properties, and is suitable for industrial application in panels of different sizes.

The porous material powder can be a hierarchical porous silica powder, and the metal catalyst layer can include a copper catalyst layer or a nickel catalyst layer or even a mixture of the copper catalyst layer and the nickel catalyst layer. In large-scale production using silica as a template and using copper or nickel as a catalyst, the production cost is low, raw materials are accessible, and the prepared graphene film has excellent effects.

Figure 2:
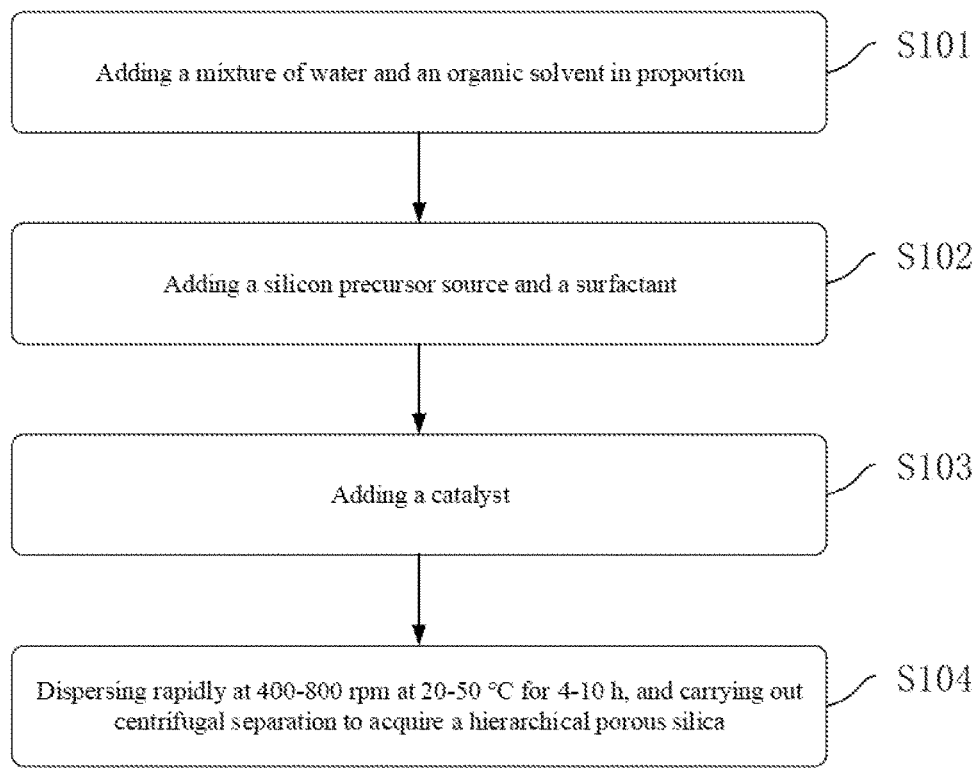
FIG. 2 is a schematic diagram of steps of a manufacturing method for a hierarchical porous silica powder according to an embodiment of the present application.

In a specific embodiment, a hierarchical porous silica (HPSi) powder can be prepared from the hierarchical porous silica by a sol-gel process. As shown in FIG. 2, the step of providing a hierarchical porous silica includes:
S101: adding a mixture of water and an organic solvent in proportion;
S102: adding a silicon precursor source and a surfactant;
S103: adding a catalyst; and
S104: dispersing rapidly at 400-800 rpm at 20-50° C. for 4-10 h, and carrying out centrifugal separation to acquire a hierarchical porous silica.

The molar ratio of the water to the organic solvent is 0.3-0.5, the catalyst has a pH value of 8-10, the organic solvent can be ethanol, isopropanol, butanol, or the like, the silicon precursor source can be Tetraethoxysilane (TEOS, $Si(OC_2H_5)_4$), the surfactant can be Hexadecyl Trimethyl Ammonium Bromide (CTAB) or Hexadecyl Trimethyl Ammonium Chloride (CTAC), and the catalyst can be ammonium hydroxide.

Figure 3:
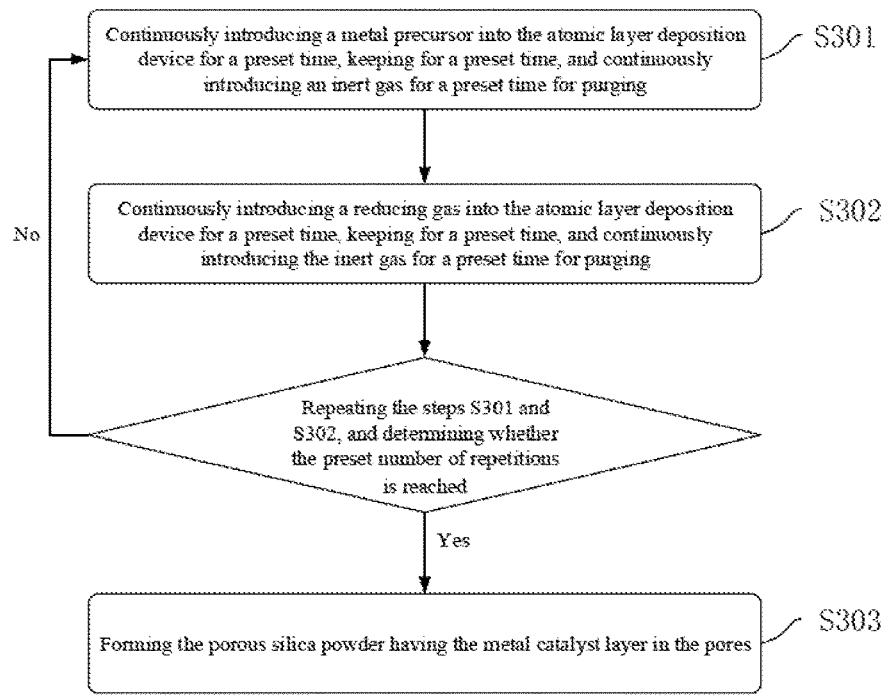
FIG. 3 is a schematic diagram of steps of a manufacturing method for a porous silica powder according to an embodiment of the present application.

As shown in FIG. 3, in another specific embodiment, the step of depositing a metal catalyst layer in the atomic layer deposition device and depositing the metal catalyst layer in pores of the porous material powder to form a porous material powder having the metal catalyst layer in the pores includes:

S301: continuously introducing a copper precursor or a nickel precursor into the atomic layer deposition device for a preset time, keeping for a preset time, and continuously introducing an inert gas for a preset time for purging;

S302: continuously introducing a reducing gas into the atomic layer deposition device for a preset time, keeping for a preset time, and continuously introducing the inert gas for a preset time for purging; and S303: repeating the two steps S301 and S302 until reaching a preset number of repetitions to form the copper catalyst layer or the nickel catalyst layer.

The extent of reaction is controlled by controlling the preset time for introducing and keeping various precursors to properly control the thickness of the copper catalyst layer or the nickel catalyst layer deposited in complex channels of the porous silica powder. For example, the copper precursor or the nickel precursor is continuously introduced for a preset time of 0.01-0.2 s, and kept for a preset time of 2-20 s; the reducing gas is continuously introduced for a preset time of 0.01-0.5 s, and kept for a preset time of 2-20 s. The copper precursor or the nickel precursor and the reducing gas are continuously introduced at a rate of 5-30 sccm. However, based on experimental data, the preset introducing time of 0.01-0.2 s is enough for one cycle because materials of precursors are expensive. The introduced amount can be controlled by controlling the preset introducing time to prevent waste of raw materials, and the preset keeping time set to 2-20 s is enough to meet the reaction time of the current introduced amount, where the longer the preset keeping time of the reducing gas is, the more fully the reducing gas reacts with the copper precursor or the nickel precursor, and the shorter the preset keeping time is, the higher the production efficiency is; the degree of adsorption of the precursor is controlled in relative to the preset keeping time of the copper precursor or the nickel precursor, and the longer the corresponding preset keeping time is, the more the adsorption capacity is, and the shorter the corresponding preset keeping time is, the higher the production efficiency is.

Specifically, the thickness of the copper catalyst layer or the nickel catalyst layer is optionally controlled at 10-30 nm, and the preset number of times for repeating the above steps is correspondingly 50-200. It should be noted that different preset number of repetitions can be correspondingly set according to the thickness of the copper catalyst layer or the nickel catalyst layer to be formed.

The copper precursor can be at least one of N,N-diisopropyl copper acetate, 1,5-cyclooctadiene(hexafluoro-2,4-pentanedionato)copper and copper acetylacetonate, and the corresponding reducing gas is hydrogen; the precursors have high raw material activity and high reaction speed, which helps save raw materials and improve the production efficiency. The copper precursor and the reducing gas selected in the present application can meet the requirements without setting too high temperature in the reaction chamber of the ALD device. The intensity of pressure of the ALD device is set at 0.05-10 torr, and the temperature is set at 150-300° C. The low-temperature working environment provides favorable conditions for developing flexible display devices and their application in OLED, brings convenience for wide application of the indium gallium zinc oxide in the development of flexible display devices and application in OLED, and improves the stability of display panels.

Specifically, the step of forming a porous material template having the metal catalyst layer in the pores by using the porous material powder having the metal catalyst layer in the pores includes depositing the porous silica powder deposited with the copper catalyst layer or the nickel catalyst layer in an organic alcohol solution and pressing to form a silica template, where the organic alcohol solution can be ethanol, glycerol, n-butyl alcohol, or the like. Compared with a direct film forming process, the method allows the silica template to provide more channel space for subsequent deposition of graphene.

Figure 4:
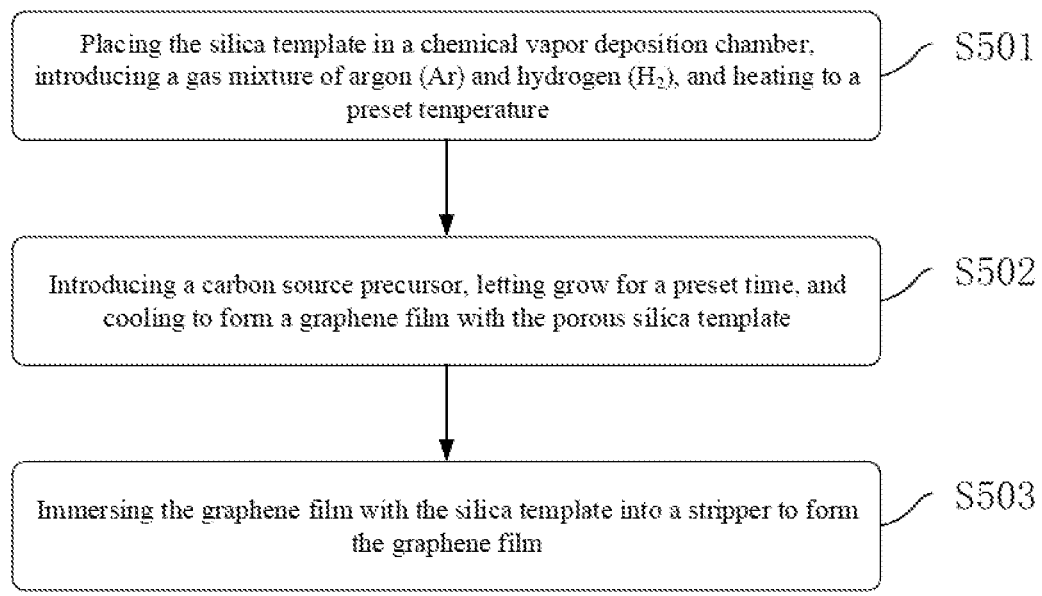
FIG. 4 is a schematic diagram of steps of a manufacturing method for a graphene film according to another embodiment of the present application.

As shown in FIG. 4, in another specific embodiment, the step of preparing the graphene film on the porous material template includes steps of:

S501: placing the silica template in a chemical vapor deposition chamber, introducing a gas mixture of argon (Ar) and hydrogen ($H_2$), and heating to a preset temperature, where hydrogen is introduced at a rate of 80-120 sccm;

S502: introducing a carbon source precursor, letting grow for a preset time, and cooling to form a graphene film with the porous silica template, where the carbon source precursor that is optionally introduced at a rate of 10-30 sccm and heated to 800-1200° C., and includes CH4, C2H2, C2H6 or the like, and the preset growth time is set to 1-5 min; and S503: immersing the graphene film with the silica template into a stripper to form the graphene film. The stripper can be a mixture of a FeCl3 solution and a hydrofluoric acid solution, or a mixture of a FeCl3 solution and a sodium hydroxide solution, or the graphene film can be sequentially immersed in the FeCl3 solution and the sodium hydroxide solution, or in the FeCl3 solution and the hydrofluoric acid solution. The FeCl3 solution can remove the copper catalyst layer in the graphene film with the silica template, and the hydrofluoric acid solution and the sodium hydroxide solution can remove the silica template in the graphene film with the silica template.

Figure 5:
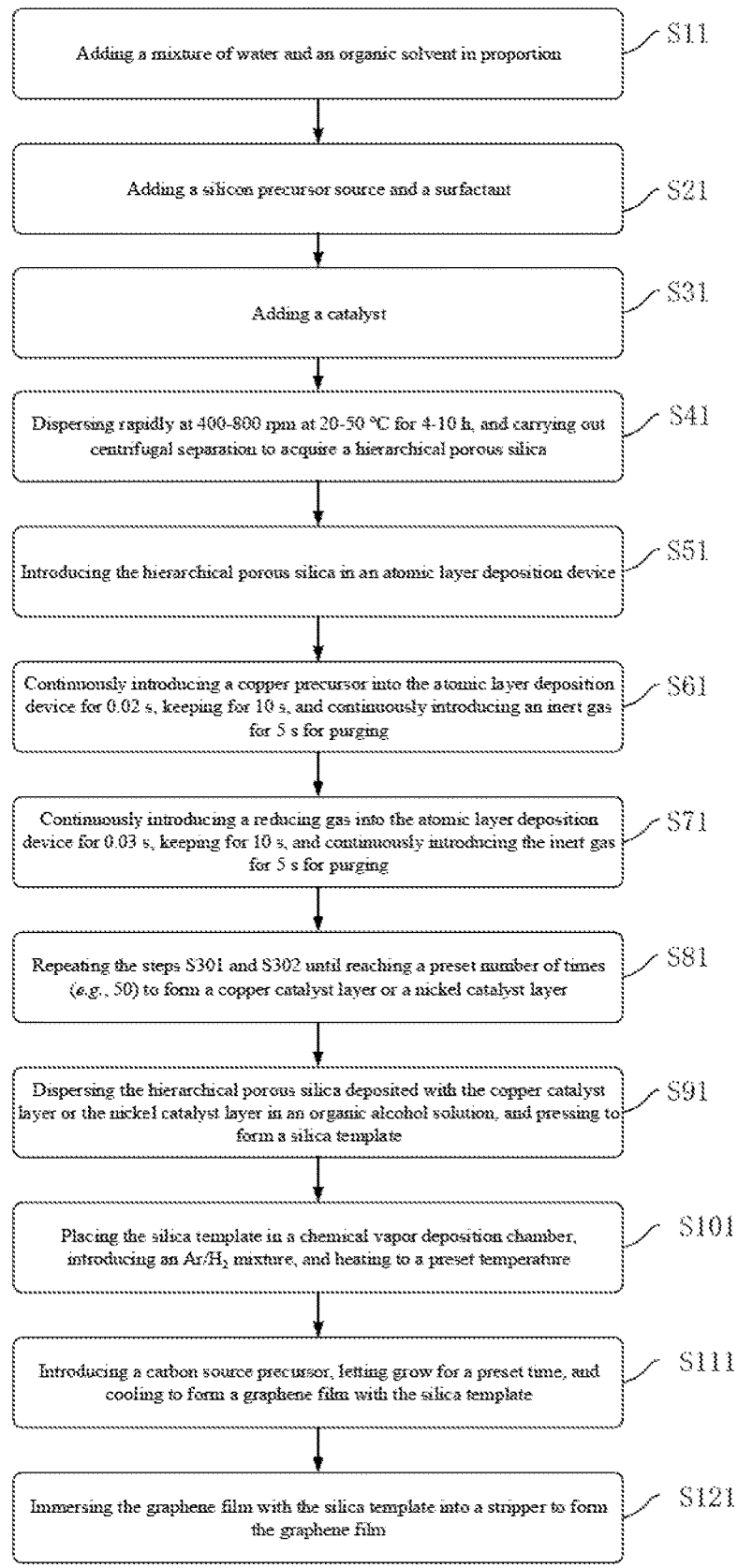
FIG. 5 is a schematic diagram of steps of a manufacturing method for a graphene film according to another embodiment of the present application.

As shown in FIG. 5, as a specific embodiment of the present application, a manufacturing method for a graphene film is disclosed, including steps of:

S11: adding a mixture of water and an organic solvent (e.g., ethanol, isopropanol and butanol) in proportion;

S21: adding a silicon precursor source (e.g., Tetraethoxysilane) and a surfactant (e.g., CTAB, CTAC);

S31: adding a catalyst (e.g., ammonium hydroxide);

S41: dispersing rapidly at 400-800 rpm at 20-50° C. for 4-10 h, and carrying out centrifugal separation to acquire a hierarchical porous silica;

S51: placing the hierarchical porous silica in an atomic layer deposition device;

S61: continuously introducing a copper precursor (e.g., at least one of N,N-diisopropyl copper acetate, 1,5-cyclooctadiene(hexafluoro-2,4-pentanedionato)copper and copper acetylacetonate) or a nickel precursor for 0.02 s into the atomic layer deposition device, keeping for 10 s, and continuously introducing an inert gas (e.g., argon) for 5 s for purging;

S71: continuously introducing a reducing gas (hydrogen) for 0.03 s in the atomic layer deposition device, keeping for 10 s, and continuously introducing the inert gas (e.g., argon) for 5 s for purging;

S81: repeating the steps S61 and S71 until reaching a preset number of times (e.g., 50) to form a copper catalyst layer or a nickel catalyst layer;

S91: dispersing the hierarchical porous silica deposited with the copper catalyst layer or the nickel catalyst layer in an organic alcohol solution, and pressing to form a silica template;

S101: placing the silica template in a chemical vapor deposition chamber, introducing an Ar/H$_2$ mixture, and heating to a preset temperature;

S111: introducing a carbon source precursor, letting grow for a preset time, and cooling to form a graphene film with the silica template; and S121: immersing the graphene film with the silica template into a stripper to form the graphene film.

Figure 6:
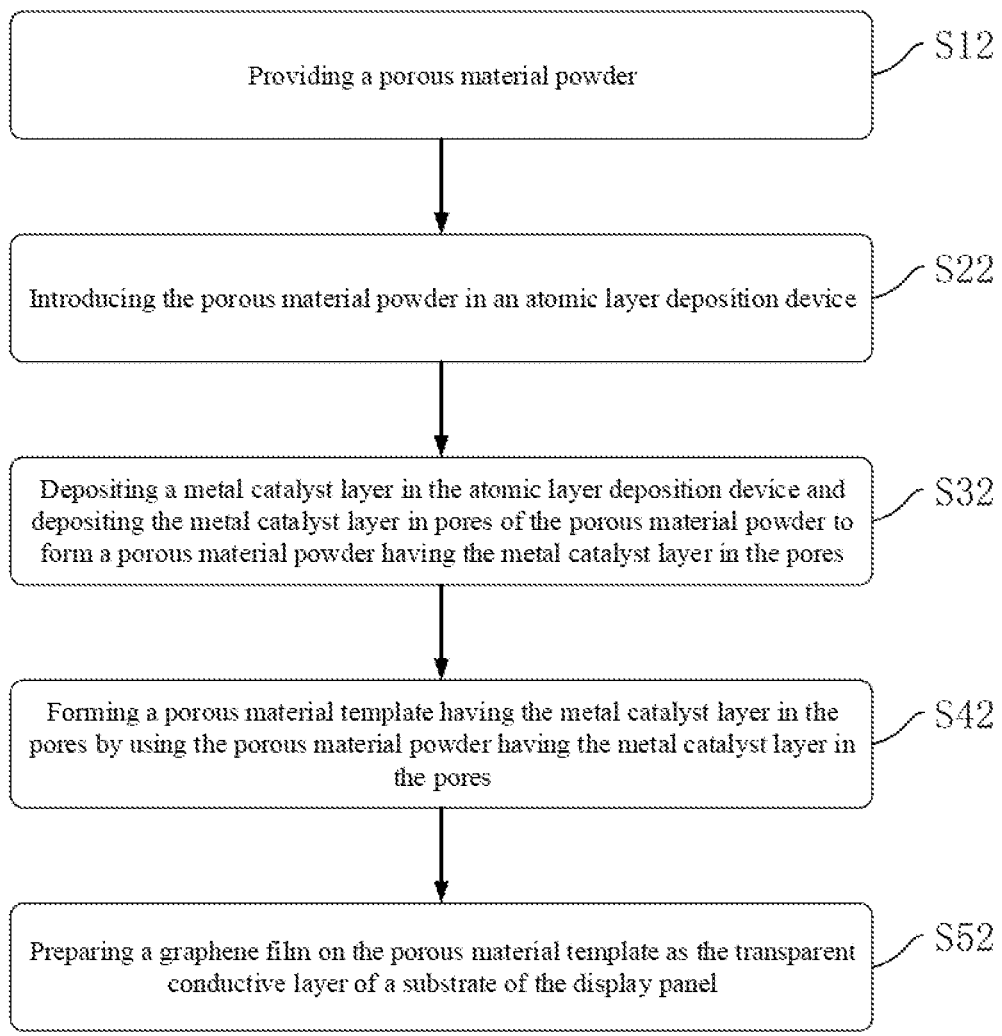
FIG. 6 is a schematic diagram of steps of a manufacturing method for a transparent electrode layer of a display panel according to an embodiment of the present application.

As a specific embodiment of the present application, as shown in FIG. 6, the present application further discloses a manufacturing method for a display panel, including a step of forming a graphene film as a transparent conductive layer of the display panel, and the manufacturing method for the transparent conductive layer of the display panel includes steps of:

S12: providing a porous material powder;

S22: placing the porous material powder in an atomic layer deposition device;

S32: depositing a metal catalyst layer in the atomic layer deposition device and depositing the metal catalyst layer in pores of the porous material powder to form a porous material powder having the metal catalyst layer in the pores;

S42: forming a porous material template having the metal catalyst layer in the pores by using the porous material powder having the metal catalyst layer in the pores; and S52: preparing a graphene film on the porous material template as the transparent conductive layer of a substrate of the display panel.

Figure 7:
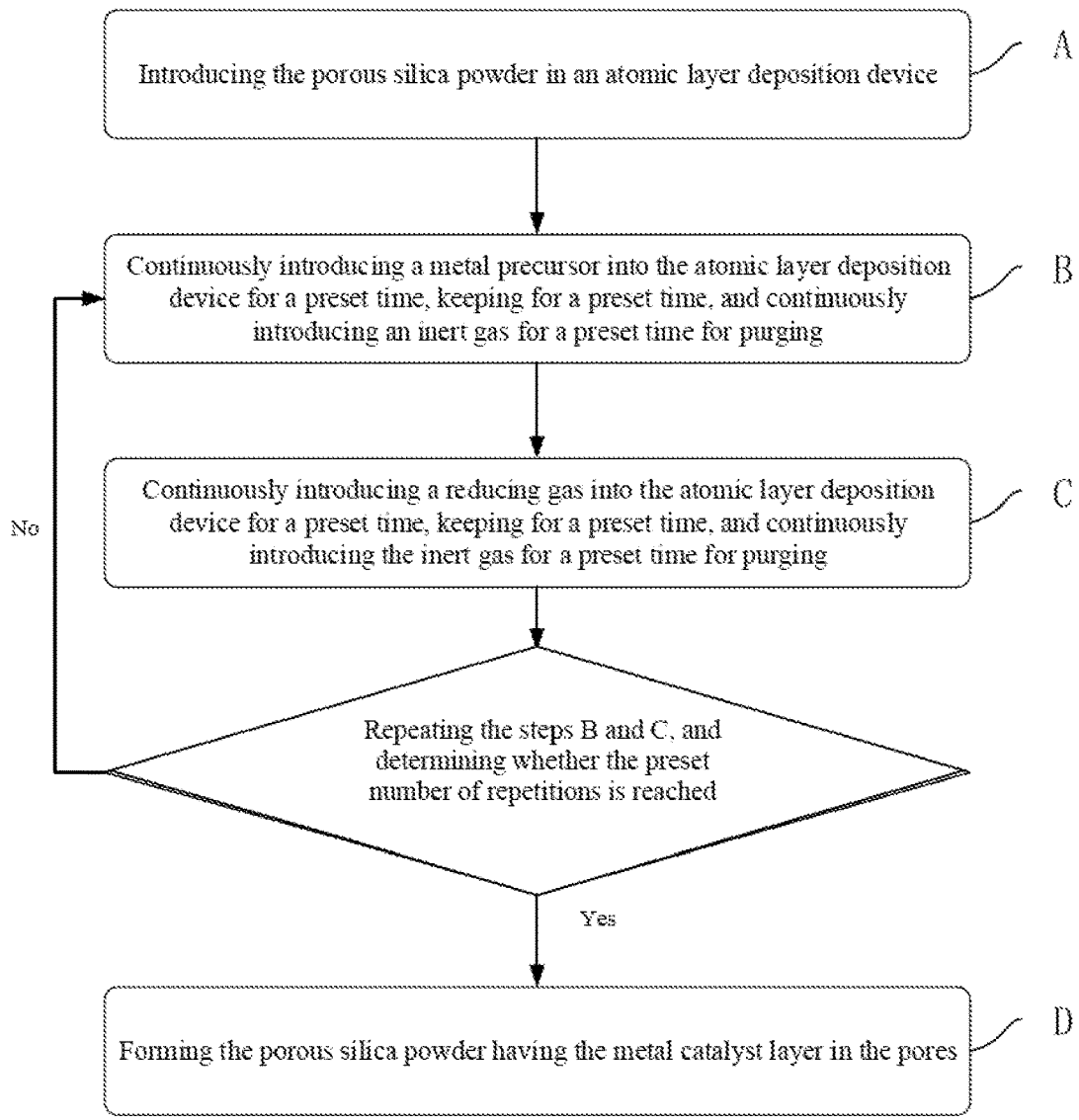
FIG. 7 is a schematic diagram of steps of a manufacturing method for a porous silica powder according to another embodiment of the present application.

Meanwhile, the present application further discloses a manufacturing method for a porous silica powder having a metal catalyst layer in pores. As shown in FIG. 7, the method includes steps of:

A: placing a porous silica powder in an atomic layer deposition device;

B: continuously introducing a metal precursor into the atomic layer deposition device for a preset time, keeping for a preset time, and continuously introducing an inert gas for a preset time for purging;

C: continuously introducing a reducing gas into the atomic layer deposition device for a preset time, keeping for a preset time, and continuously introducing the inert gas for a preset time for purging; and D: repeating the steps B and C for a preset number of times to acquire the porous silica powder having the metal catalyst layer in the pores.

The metal catalyst layer of the porous silica powder having the metal catalyst layer in the pores prepared by the method is distributed extensively and widely. The porous silica powder having the metal catalyst layer in the pores can be adopted to prepare a porous silica template for further preparing a graphene film, and can also be adopted to prepare materials such as carbon nanotubes and carbon fibers as needed.

Figure 8:
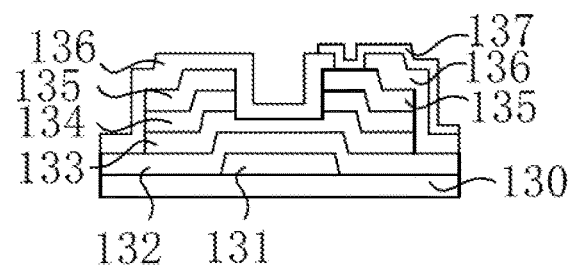
FIG. 8 is a schematic structural view of a display panel according to an embodiment of the present application.

FIG. 8 shows a display panel manufactured by the manufacturing method for a display panel in FIG. 6, where the display panel includes: a substrate 130, a gate metal layer 131, a gate insulating layer 132, an amorphous silicon active layer 133, an ohmic contact layer 134, a source/drain metal layer 135, a protective layer 136 and a transparent conductive layer 137.

It should be noted that, the limitation of the steps involved in this solution, without affecting the implementation of the specific solution, is not determined to limit the sequence of steps, and the previous steps may be executed first, later, or even simultaneously. Any sequence shall be deemed to fall within the scope of the present application as long as the solution can be implemented.

The technical solution of the present application can be widely adopted to produce transparent conductive layers of a variety of display panels, such as Twisted Nematic (TN) display panels, In-Plane Switching (IPS) display panels, Vertical Alignment (VA) display panels, Multi-Domain Vertical Alignment (MVA) display panels, and other types of display panels, such as Organic Light-Emitting Diode (OLED) display panels.

The above content is a further detailed description of the present application in conjunction with specific optional embodiments, and it is not to be construed that specific embodiments of the present application are limited to these descriptions. For those of ordinary skill in the art to which the present application belongs, a number of simple derivations or substitutions may be made without departing from the spirit of the present application, all of which shall be deemed to fall within the scope of the present application.

What is claimed is:

1. A manufacturing method for a graphene film, comprising steps of:

providing a porous material powder;

putting the porous material powder into an atomic layer deposition device;

depositing a metal catalyst layer in pores of the porous material powder to form a porous material powder having the metal catalyst layer in the pores;

depositing the porous material powder in an organic alcohol solution and pressing to form a silica template, and introducing a carbon source precursor on the silica template, letting grow for a preset time to form a graphene film.

2. The manufacturing method for a graphene film according to claim 1, wherein in the step of providing a porous material powder:

the porous material powder is a hierarchical porous silica powder.

3. The manufacturing method for a graphene film according to claim 1, wherein in the step of depositing a metal catalyst layer in pores of the porous material powder to form a porous material powder having the metal catalyst layer in the pores:

the metal catalyst layer comprises a copper catalyst layer or a nickel catalyst layer.

4. The manufacturing method for a graphene film according to claim 3, wherein the thickness of the copper catalyst layer or the nickel catalyst layer is 10-30 nm.

5. The manufacturing method for a graphene film according to claim 3, wherein the step of depositing a metal catalyst layer in pores of the porous material powder to form a porous material powder having the metal catalyst layer in the pores comprises:

continuously introducing a copper precursor or a nickel precursor into the atomic layer deposition device for a preset time, keeping for a preset time, and continuously introducing an inert gas for a preset time for purging;

continuously introducing a reducing gas into the atomic layer deposition device for a preset time, keeping for a preset time, and continuously introducing the inert gas for a preset time for purging; and repeating the two steps until reaching a preset number of repetitions to form the copper catalyst layer or the nickel catalyst layer.

6. The manufacturing method for a graphene film according to claim 5, wherein the copper precursor or the nickel precursor is continuously introduced for a preset time of 0.01-0.2 s, and kept for a preset time of 2-20 s; the reducing gas is continuously introduced for a preset time of 0.01-0.5 s, and kept for a preset time of 2-20 s.

7. The manufacturing method for a graphene film according to claim 5, wherein the copper precursor comprises: at least one of N,N-diisopropyl copper acetate, 1,5-cyclooctadiene copper, hexafluoro-2,4-pentanedione copper and copper acetylacetonate.

8. The manufacturing method for a graphene film according to claim 1, wherein the step of introducing a carbon source precursor on the silica template, letting grow for a preset time to form a graphene film comprises steps of:
    placing the porous material template in a chemical vapor deposition chamber, introducing a gas mixture of argon (Ar) and hydrogen ($H_2$), and heating to a preset temperature;
    introducing a carbon source precursor, letting grow for a preset time, and then cooling to form a graphene film with the porous material template; and
    immersing the graphene film with the porous material template into a stripper to form the graphene film.

9. The manufacturing method for a graphene film according to claim 2, wherein the step of providing a porous material powder comprises:
    adding a mixture of water and an organic solvent in proportion;
    adding a silicon precursor source and a surfactant;
    adding a catalyst; and
    dispersing rapidly at 400-800 rpm at 20-50° C. for 4-10 h, and carrying out centrifugal separation to acquire a hierarchical porous silica.

10. The manufacturing method for a graphene film according to claim 9, wherein the molar ratio of the water to the organic solvent is 0.3-0.5, the catalyst has a pH value of 8-10, the organic solvent comprises any one or more of ethanol, isopropanol and butanol, the silicon precursor source is Tetraethoxysilane (TEOS, $Si(OC_2H_5)_4$), the surfactant is Hexadecyl Trimethyl Ammonium Bromide (CTAB) or Hexadecyl Trimethyl Ammonium Chloride (CTAC), and the catalyst is ammonium hydroxide.

11. The manufacturing method for a graphene film according to claim 5, wherein the preset number of repetitions is between 50 and 200.

12. The manufacturing method for a graphene film according to claim 1, wherein the atomic layer deposition device is set at an intensity of pressure of 0.05-10 torr and a temperature of 150-300° C.

13. The manufacturing method for a graphene film according to claim 8, wherein the hydrogen is introduced at a rate of 80-120 sccm and heated to 800-1200° C.; the carbon source precursor is optionally introduced at a rate of 10-30 sccm and comprises at least one of CH4, C2H2 and C2H6, and the preset growth time is set to 1-5 min.

14. A manufacturing method for a porous silica powder having a metal catalyst layer in pores, comprising steps of:
    A: placing a porous silica powder in an atomic layer deposition device;
    B: continuously introducing a metal precursor into the atomic layer deposition device for a preset time, keeping for a preset time, and continuously introducing an inert gas for a preset time for purging;
    C: continuously introducing a reducing gas into the atomic layer deposition device for a preset time, keeping for a preset time, and continuously introducing the inert gas for a preset time for purging; and
    D: repeating the steps B and C for a preset number of times to acquire the porous silica powder having the metal catalyst layer in the pores.

15. The manufacturing method for a porous silica powder having a metal catalyst layer in pores according to claim 14, wherein the step of placing a porous silica powder in the atomic layer deposition device comprises:
    adding a mixture of water and an organic solvent in proportion;
    adding a silicon precursor source and a surfactant;
    adding a catalyst; and
    dispersing rapidly at 400-800 rpm at 20-50° C. for 4-10 h, and carrying out centrifugal separation to acquire a hierarchical porous silica.

16. The manufacturing method for a porous silica powder having a metal catalyst layer in pores according to claim 14, wherein the molar ratio of the water to the organic solvent is 0.3-0.5, the catalyst has a pH value of 8-10, the organic solvent comprises any one or more of ethanol, isopropanol and butanol, the silicon precursor source is Tetraethoxysilane, the surfactant is Hexadecyl Trimethyl Ammonium Bromide or Hexadecyl Trimethyl Ammonium Chloride, and the catalyst is ammonium hydroxide.

17. A manufacturing method for a transparent conductive layer of a display panel, comprising steps of:
    providing a porous material powder;
    placing the porous material powder in an atomic layer deposition device;
    depositing a metal catalyst layer in the atomic layer deposition device and depositing the metal catalyst layer in pores of the porous material powder to form a porous material powder having the metal catalyst layer in the pores;
    forming a porous material template having the metal catalyst layer in the pores by using the porous material powder having the metal catalyst layer in the pores; and
    preparing a graphene film on the porous material template as the transparent conductive layer of a substrate of the display panel.

18. The manufacturing method for a transparent conductive layer of a display panel according to claim 17, wherein in the step of providing a porous material powder:
    the porous material powder is a hierarchical porous silica powder.

19. The manufacturing method for a transparent conductive layer of a display panel according to claim 17, wherein in the step of depositing a metal catalyst layer in the atomic layer deposition device and depositing the metal catalyst layer in pores of the porous material powder to form a porous material powder having the metal catalyst layer in the pores:
    the metal catalyst layer comprises a copper catalyst layer or a nickel catalyst layer.

20. The manufacturing method for a transparent conductive layer of a display panel according to claim 19, wherein the thickness of the copper catalyst layer or the nickel catalyst layer is 10-30 nm.

\* \* \* \* \*